United States Patent
DeKeuster et al.

(10) Patent No.: US 9,812,693 B2
(45) Date of Patent: Nov. 7, 2017

(54) SEPARATE WELDING PLANES FOR A BATTERY MODULE

(71) Applicant: Johnson Controls Technology Company, Holland, MI (US)

(72) Inventors: Richard M. DeKeuster, Racine, WI (US); Robert J. Mack, Milwaukee, WI (US); Edward J. Soleski, Mequon, WI (US); Jennifer L. Czarnecki, Franklin, WI (US)

(73) Assignee: Johnson Controls Technology Company, Holland, MI (US)

( * ) Notice: Subject to any disclaimer, the term of this patent is extended or adjusted under 35 U.S.C. 154(b) by 139 days.

(21) Appl. No.: 14/675,661

(22) Filed: Mar. 31, 2015

(65) Prior Publication Data

US 2016/0197333 A1 Jul. 7, 2016

Related U.S. Application Data

(60) Provisional application No. 62/100,001, filed on Jan. 5, 2015.

(51) Int. Cl.
*H01M 2/30* (2006.01)
*H01M 2/10* (2006.01)
(Continued)

(52) U.S. Cl.
CPC .......... *H01M 2/305* (2013.01); *G01R 31/362* (2013.01); *G01R 31/3658* (2013.01); *H01M 2/02* (2013.01);
(Continued)

(58) Field of Classification Search
CPC .... H01M 2/34; H01M 2/1217; H01M 2/1083; H01M 2/1016; H01M 2/18; H01M 2/206;
(Continued)

(56) References Cited

U.S. PATENT DOCUMENTS

| 4,039,244 A | 8/1977 | Leachy |
| 4,288,024 A | 9/1981 | Nippert |

(Continued)

FOREIGN PATENT DOCUMENTS

| CN | 201918471 | 8/2011 |
| CN | 201946505 | 8/2011 |

(Continued)

OTHER PUBLICATIONS

PCT/US2016/013736 International Search Report dated Apr. 28, 2016.

*Primary Examiner* — Patrick Ryan
*Assistant Examiner* — Aaron Greso
(74) *Attorney, Agent, or Firm* — Fletcher Yoder, P.C.

(57) ABSTRACT

The present disclosure relates to a lithium-ion battery module including a housing having a base, a battery cell in the housing, and a battery module terminal coupled to the battery cell via an electrical pathway, wherein the battery module terminal provides an electrical output when coupled to an electrical load, and wherein the electrical pathway is defined by a first portion, a second portion, and an interconnecting portion connecting the first and second portions. The first portion has a plurality of first conductive components coupled to one another within first connection planes using a first conductive material, and the first connection planes are substantially parallel to the base. The second portion has a plurality of second conductive components coupled to one another within second connection planes using a second conductive material, different from the first conductive material, and the second connection planes are crosswise to the first connection planes.

16 Claims, 6 Drawing Sheets

(51) Int. Cl.
| | | |
|---|---|---|
| *H01M 2/20* | (2006.01) | |
| *H01M 10/052* | (2010.01) | |
| *H01M 2/22* | (2006.01) | |
| *H01M 2/32* | (2006.01) | |
| *H01M 2/12* | (2006.01) | |
| *H01M 10/48* | (2006.01) | |
| *H01M 10/613* | (2014.01) | |
| *H01M 10/625* | (2014.01) | |
| *H01M 10/647* | (2014.01) | |
| *H01M 10/653* | (2014.01) | |
| *H01M 10/6551* | (2014.01) | |
| *G01R 31/36* | (2006.01) | |
| *H01M 10/0525* | (2010.01) | |
| *H01M 10/42* | (2006.01) | |
| *H01M 10/6557* | (2014.01) | |
| *H01M 2/24* | (2006.01) | |
| *H01M 2/18* | (2006.01) | |
| *H01M 10/04* | (2006.01) | |
| *H01M 10/058* | (2010.01) | |
| *H01M 2/02* | (2006.01) | |
| *H01M 2/04* | (2006.01) | |
| *H01M 2/34* | (2006.01) | |
| *H01M 10/02* | (2006.01) | |
| *H01M 10/60* | (2014.01) | |
| *H01M 10/65* | (2014.01) | |

(52) U.S. Cl.
CPC ............... *H01M 2/04* (2013.01); *H01M 2/10* (2013.01); *H01M 2/1005* (2013.01); *H01M 2/1016* (2013.01); *H01M 2/1072* (2013.01); *H01M 2/1077* (2013.01); *H01M 2/1083* (2013.01); *H01M 2/12* (2013.01); *H01M 2/1205* (2013.01); *H01M 2/1211* (2013.01); *H01M 2/1217* (2013.01); *H01M 2/1241* (2013.01); *H01M 2/1252* (2013.01); *H01M 2/1294* (2013.01); *H01M 2/18* (2013.01); *H01M 2/20* (2013.01); *H01M 2/206* (2013.01); *H01M 2/22* (2013.01); *H01M 2/24* (2013.01); *H01M 2/30* (2013.01); *H01M 2/32* (2013.01); *H01M 2/34* (2013.01); *H01M 10/02* (2013.01); *H01M 10/0413* (2013.01); *H01M 10/052* (2013.01); *H01M 10/058* (2013.01); *H01M 10/0525* (2013.01); *H01M 10/4207* (2013.01); *H01M 10/4257* (2013.01); *H01M 10/482* (2013.01); *H01M 10/60* (2015.04); *H01M 10/613* (2015.04); *H01M 10/625* (2015.04); *H01M 10/647* (2015.04); *H01M 10/65* (2015.04); *H01M 10/6551* (2015.04); *H01M 10/6557* (2015.04); *H01M 2010/4271* (2013.01); *H01M 2220/10* (2013.01); *H01M 2220/20* (2013.01)

(58) Field of Classification Search
CPC .......... H01M 2/32; H01M 2/22; H01M 2/107; H01M 2/02; H01M 2/1241; H01M 2/1252; H01M 2/12; H01M 2/1205; H01M 2/04; H01M 2/10; H01M 2/1077; H01M 2/1005; H01M 2/30; H01M 2/24; H01M 2/1294; H01M 10/6551; H01M 10/60; H01M 10/65; H01M 10/02; H01M 10/625; H01M 10/0525; H01M 10/6557; H01M 10/647; H01M 10/0413; H01M 10/482; H01M 10/4257; H01M 10/653; H01M 10/4207; H01M 10/058; H01M 10/613; H01M 2220/10; H01M 2220/20; H01M 2010/4271; H01M 2/1072; H01M 10/052; H01M 2/305; H01M 2/1211; H01M 2/20; G01R 31/362; G01R 31/3658

See application file for complete search history.

(56) References Cited

U.S. PATENT DOCUMENTS

| | | | |
|---|---|---|---|
| 5,424,149 | A | 6/1995 | Imhof et al. |
| 5,716,735 | A | 2/1998 | Muffoletto et al. |
| 6,929,504 | B2 | 8/2005 | Ling et al. |
| 7,192,508 | B2 | 3/2007 | Torvund |
| 7,317,466 | B2 | 1/2008 | Conrard et al. |
| 8,268,021 | B2 | 9/2012 | Yoshida et al. |
| 8,555,946 | B2 | 10/2013 | Luo et al. |
| 8,574,008 | B2 | 11/2013 | Große et al. |
| 8,628,875 | B2 | 1/2014 | Kim et al. |
| 8,695,867 | B2 | 4/2014 | Khakhalev |
| 8,801,444 | B2 | 8/2014 | Sakae et al. |
| 8,816,390 | B2 | 8/2014 | Marbella et al. |
| 9,136,521 | B2 | 9/2015 | Lee et al. |
| 9,142,840 | B2 | 9/2015 | Rich et al. |
| 2002/0079865 | A1* | 6/2002 | Thomas ............... H02H 9/042 320/136 |
| 2005/0208346 | A1 | 9/2005 | Moon et al. |
| 2006/0216594 | A1* | 9/2006 | You ..................... H01M 2/021 429/180 |
| 2007/0170158 | A1 | 7/2007 | Greig |
| 2008/0070067 | A1* | 3/2008 | Jang ..................... H01M 2/30 429/8 |
| 2011/0076521 | A1 | 3/2011 | Shimizu et al. |
| 2011/0081568 | A1 | 4/2011 | Kim et al. |
| 2011/0263944 | A1* | 10/2011 | Cau ................... A61B 17/0218 600/204 |
| 2012/0298433 | A1 | 11/2012 | Ohkura |
| 2013/0065107 | A1 | 3/2013 | Payne |
| 2014/0318613 | A1 | 10/2014 | Von Campe et al. |
| 2015/0207127 | A1 | 7/2015 | Davis et al. |
| 2015/0214530 | A1 | 7/2015 | Lee |
| 2015/0249245 | A1 | 9/2015 | Ahn |
| 2016/0093862 | A1 | 3/2016 | DeKeuster et al. |

FOREIGN PATENT DOCUMENTS

| | | | | |
|---|---|---|---|---|
| CN | 102407408 | * | 4/2012 | ............. B23K 33/00 |
| CN | 102646547 | | 8/2012 | |
| CN | 102709508 | | 10/2012 | |
| CN | 103753042 | | 4/2014 | |
| EP | 2607007 | | 6/2013 | |
| EP | 2441103 B1 | | 7/2014 | |
| EP | 2894695 | | 7/2015 | |
| JP | 2004039651 | * | 2/2004 | ............. H01M 2/30 |
| JP | 2005019416 | | 1/2005 | |
| JP | 2006100054 | | 4/2006 | |
| JP | 2010251119 | | 11/2010 | |
| WO | 2012161594 A1 | | 11/2012 | |
| WO | 2013051012 A2 | | 4/2013 | |
| WO | 2015124264 | | 8/2015 | |

* cited by examiner

SEPARATE WELDING PLANES FOR A BATTERY MODULE

CROSS REFERENCE TO RELATED APPLICATIONS

This application claims priority from and the benefit of U.S. Provisional Application Ser. No. 62/100,001, entitled "MECHANICAL AND ELECTRICAL ASPECTS OF LITHIUM ION BATTERY MODULE WITH VERTICAL AND HORIZONTAL CONFIGURATIONS," filed Jan. 5, 2015, which is hereby incorporated by reference, in its entirety for all purposes.

BACKGROUND

The present disclosure relates generally to the field of batteries and battery modules. More specifically, the present disclosure relates to separate welding planes for a battery module.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Start-Stop" system similar to the mild hybrids, but the micro-hybrid systems may or may not supply power assist to the internal combustion engine and operate at a voltage below 60V. For the purposes of the present discussion, it should be noted that mHEVs typically do not technically use electric power provided directly to the crankshaft or transmission for any portion of the motive force of the vehicle, but an mHEV may still be considered an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery module. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles and other implementations. For example, connections established between various conductive components of a battery module may be formed using a weld. Unfortunately, some of these connections may be difficult to make, or may be less than optimal because of the presence of dissimilar materials. While it may be desirable to simply couple different conductive materials directly, such connections may be subject to unwanted galvanic effects, which can degrade the connections. Accordingly, it is now recognized that improved transitions between dissimilar conductive materials are desirable to enhance the stability and lifetime of the battery.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a lithium-ion battery module that includes a housing having a base, a battery cell disposed in the housing, and a battery module terminal electrically coupled to the battery cell via an electrical pathway, where the battery module terminal is configured to provide an electrical output of the battery module when coupled to an electrical load, and wherein the electrical pathway is defined by a first portion, a second portion, and an interconnecting portion connecting the first portion and the second portion. The first portion of the electrical pathway has a plurality of first conductive components electrically coupled to one another within first connection planes using a first conductive material, and the first connection planes are substantially parallel to the base of the housing. The second portion of the electrical pathway includes a plurality of second conductive components electrically coupled to one another within second connection planes using a second conductive material, different from the first conductive material, and the second connection planes are oriented crosswise relative to the first connection planes.

The present disclosure also relates to a method for constructing a lithium-ion battery module that includes accessing a first side of a housing of the battery module, where the lithium-ion battery module includes a battery cell. The method also couples a plurality of first conductive components to one another via a first plurality of welds on the first side, wherein the first plurality of welds are produced within first connection planes using a first conductive material, and the first connection planes are substantially parallel to a base of the housing. The method also accesses a second side of the housing, crosswise to the first side, and couples a plurality of second conductive components to one another via a second plurality of welds on the second side. The second plurality of welds are produced within second connection planes using a second conductive material, different from the first conductive material, and the second connection planes are oriented crosswise relative to the first connection planes. Finally, the method couples the plurality of first conductive components to the plurality of second conductive components via an interconnecting portion having the first conductive material at a first end and the second conductive material at a second end.

The present disclosure further relates to a lithium-ion battery module that includes a housing having a base, a battery cell disposed in the housing and having a cell orientation direction, and a battery module terminal electrically coupled to the battery cell via an electrical pathway. The electrical pathway is produced according to a process that includes accessing a first side of the housing, coupling a plurality of first conductive components to one another via a first plurality of welds on the first side, where the first plurality of welds are produced within first connection planes using a first conductive material, and the first connection planes are substantially parallel to a base of the housing, and accessing a second side of the housing, crosswise to the first side. The process of producing the electrical pathway also includes coupling a plurality of second conductive components to one another via a second plurality of welds on the second side, where the second plurality of welds are produced within second connection planes using a second conductive material, different from the first conductive material, and the second connection planes are oriented crosswise relative to the first connection planes. Finally, the process of producing the electrical pathway includes coupling the plurality of first conductive components to the plurality of second conductive components via an interconnecting portion having the first conductive material at a first end and the second conductive material at a second end.

DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Connections established between various conductive components of a battery module may be metallurgical, and may be formed using welding techniques, or other suitable techniques. Unfortunately, some of these connections may be difficult to make, or may be less than optimal because of the presence of dissimilar materials present in the battery module. For example, cell terminals may include a first conductive material (e.g., aluminum), while module terminals may include a second conductive material (e.g., copper). Although it may seem desirable to directly couple dissimilar conductive materials together, such connections may be subject to unwanted galvanic effects (e.g., corrosion), which can degrade the connections. Accordingly, it is now recognized that improved transitions between dissimilar conductive materials (e.g., metals of conductive module components) are desirable, for example to enhance the stability and lifetime of the battery.

Additionally, present embodiments are generally directed toward separation of planes (e.g., directions) for welding performed during assembly of a battery module (e.g., a lithium ion battery module). The use of the term "welding" in the present disclosure is intended to encompass any suitable method (or bond resulting from any such method) for coupling two conductive materials (e.g., metals or metal-containing materials) together. Non-limiting examples of methods encompassed by the present disclosure include ultrasonic welding, laser welding, tungsten inert gas (TIG) welding, arc welding, friction welding, and so forth. Although the present disclosure focuses discussion on applying the disclosed techniques to a lithium ion battery module, it should be recognized that the lithium ion battery module is but one example of a module that may be subject to one or more aspects of the present disclosure, and should not be considered to limit the present disclosure to one specific module configuration.

Figure 1:
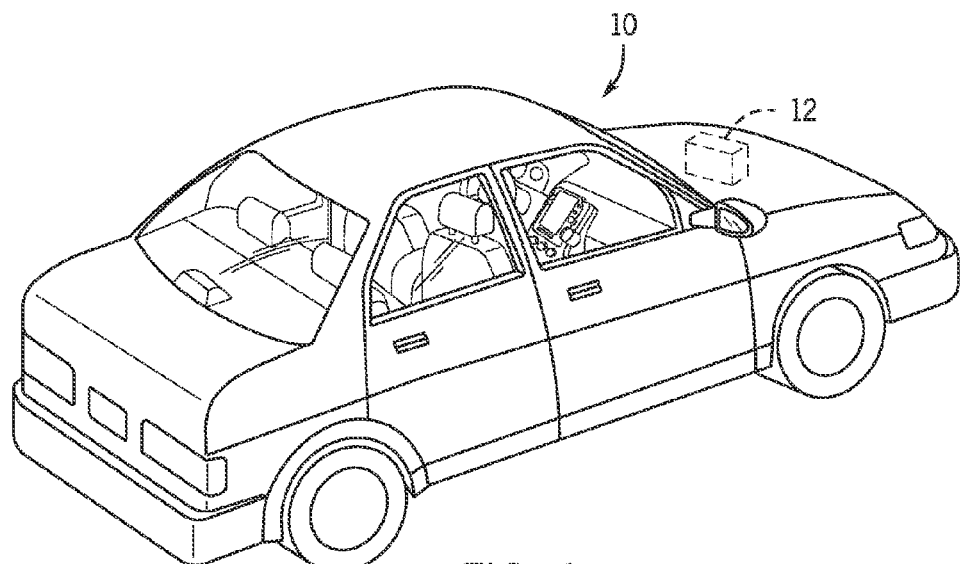
FIG. 1 is a perspective view of an xEV having a battery system configured to provide power for various components of the xEV, in accordance with an aspect of the present disclosure.

To help illustrate, FIG. 1 is a perspective view of an embodiment of a vehicle 10, which may utilize a battery system 12 constructed in accordance with presently disclosed techniques. It is now recognized that it is desirable for the non-traditional battery system 12 (e.g., a lithium ion car battery) to be largely compatible with traditional vehicle designs. In this respect, present embodiments include various types of battery modules for xEVs and systems that include xEVs. Accordingly, the battery system 12 may be placed in a location in the vehicle 10 that would have housed a traditional battery system (e.g., a standard 12V lead acid battery). For example, as illustrated, the vehicle 10 may include the battery system 12 positioned similarly to a lead-acid battery of a combustion-engine vehicle (e.g., under the hood of the vehicle 10).

Figure 2:
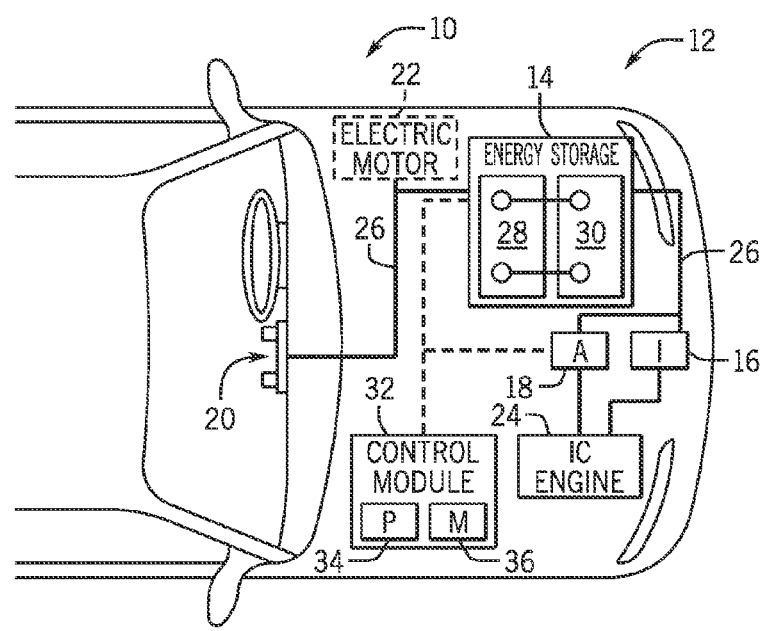
FIG. 2 is a cutaway schematic view of an embodiment of the xEV that utilizes the battery system of FIG. 1, in accordance with an aspect of the present disclosure.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical components in the vehicle 10. Additionally, the energy storage component 14 may output electrical energy to start (e.g., re-start or re-ignite) an internal combustion engine 24. For example, in a start-stop application, to preserve fuel the internal combustion engine 24 may idle when the vehicle 10 stops. Thus, the energy storage component 14 may supply energy to re-start the internal combustion engine 24 when propulsion is demanded by the vehicle 10.

The battery system 12 may also supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. In the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally, or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20.

Additionally, as depicted, the energy storage component 14 may include multiple battery modules. For example, in the depicted embodiment, the energy storage component 14 includes a lithium ion (e.g., a first) battery module 28 and a lead acid (e.g., a second) battery module 30, which each includes one or more battery cells. Additionally, the energy storage component 14 may include any number of battery modules, all or some of which may be constructed in accordance with the presently disclosed techniques. Although the lithium ion battery module 28 and lead-acid battery module 30 are depicted adjacent to one another, they may be positioned in different areas around the vehicle. For example, the lead-acid battery module 30 may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, when the lithium ion battery module 28 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32 (e.g., a battery management system). More specifically, the control module 32 may control operations of components in the battery system 12, such as relays (e.g., switches) within the energy storage component 14, the alternator 18, and/or the electric motor 22. For example, the control module 32 may regulate an amount of electrical energy captured/supplied by each battery module 28 or 30 (e.g., to de-rate and re-rate the battery system 12), perform load balancing between the battery modules 28 and 30, determine a state of charge of each battery module 28 or 30, determine a temperature or voltage of each battery module 28 or 30 (e.g., via a signal received from one or more sensing components), control voltage output by the alternator 18 and/or the electric motor 22, and the like.

Accordingly, the control unit 32 may include one or more processor units 34 and one or more memory components 36. More specifically, the one or more processor units 34 may include one or more application specific integrated circuits (ASICs), one or more field programmable gate arrays (FPGAs), one or more general purpose processors, or any combination thereof. Additionally, the one or more memory components 36 may include volatile memory, such as random access memory (RAM), and/or non-volatile memory, such as read-only memory (ROM), optical drives, hard disc drives, or solid-state drives. In some embodiments, the control unit 32 may include portions of a vehicle control unit (VCU) and/or a separate battery control module. Furthermore, as depicted, the lithium ion battery module 28 and the lead-acid battery module 30 are connected in parallel across their terminals. In other words, the lithium ion battery module 28 and the lead-acid module 30 may be coupled in parallel to the vehicle's electrical system via the bus 26.

As discussed previously, the battery module 28 may include components that have dissimilar conductive materials. Such components may be coupled to form one or more electrical connections; however, directly coupling dissimilar conductive materials may create undesirable effects (e.g., galvanic corrosion). It is now recognized that using separate welding planes while constructing the battery module 28 and coupling dissimilar conductive materials with an interconnecting bus bar (e.g., a bus bar with a first conductive material on a first end and a second conductive material on a second end) may reduce such undesirable effects (e.g., galvanic corrosion) and enhance the life of the battery module 28.

Figure 3:
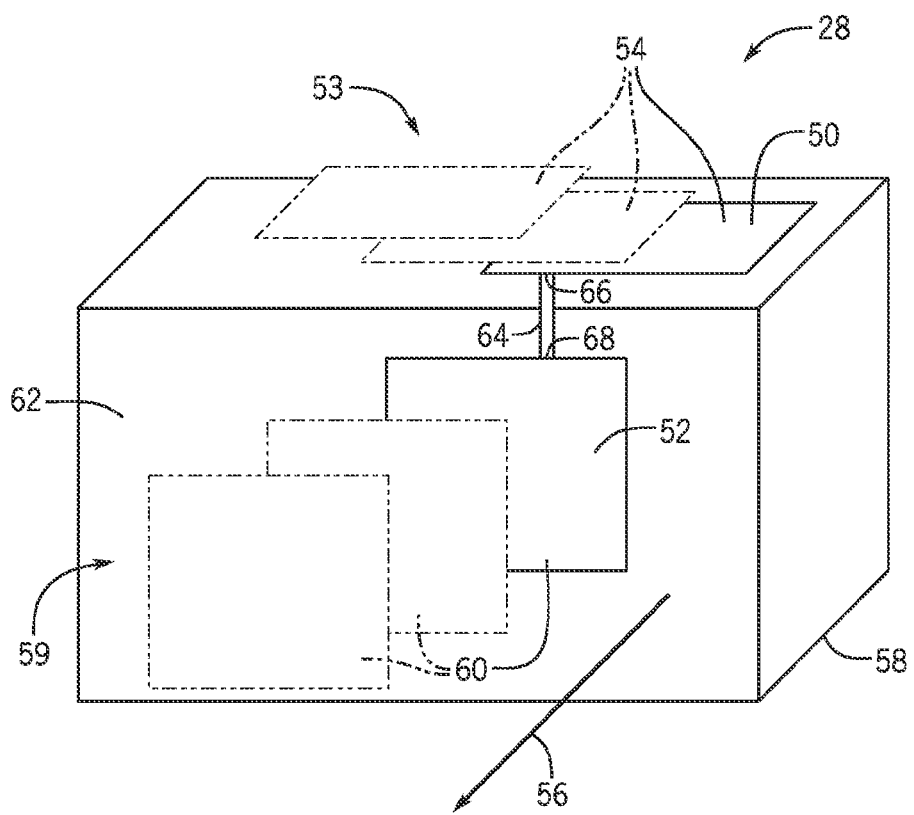
FIG. 3 is a schematic representation of a battery module constructed using separate welding planes, in accordance with an aspect of the present disclosure.

FIG. 3 illustrates a block diagram of the battery module 28 constructed according to the presently disclosed techniques. The battery module 28 may include a plurality of first conductive components 50 and a plurality of second conductive components 52. The plurality of first conductive components 50 may have a first conductive material. In certain embodiments, the first conductive material is copper. In other embodiments, the first conductive material may include aluminum, silver, gold, nickel, calcium, tungsten, zinc, lithium, platinum, titanium, lead, tin, iron, steel, or any combination thereof. The plurality of first conductive components 50 may include, for example, a battery module terminal, a module terminal bus bar, cabling, a shunt, a shunt bridge, a printed circuit board ("PCB"), a relay bus bar, a relay connector, a relay, or the like, but are not limited to such components. The plurality of first conductive components 50 may be coupled to one another via one or more welds that establish an electrical connection between the plurality of first conductive components 50.

Generally, the first conductive components 50 may be coupled via operations performed at a first side 53 or face of the lithium ion battery module 28. In accordance with certain embodiments of the present disclosure, the plurality of first conductive components 50 may be coupled to one another in first connection planes 54 (e.g., first welding planes). The first connection planes 54 may include one or more planes that are substantially parallel with one another. The first connection planes 54 may extend along a battery cell orientation direction 56. The battery cell orientation direction 56 may be a direction in which battery cells of the battery module are positioned (e.g., direction of the battery cell terminals). Additionally, the first connection planes 54 may be substantially parallel to a base 58 of a housing of the battery module 28.

In certain embodiments, the plurality of second conductive components 52 may have a second conductive material different from the first conductive material of the first conductive components 50. In certain embodiments, the second conductive material is aluminum. In other embodiments, the second conductive material may include copper, silver, gold, nickel, calcium, tungsten, zinc, lithium, platinum, titanium, lead, tin, iron, steel, or any combination thereof. The plurality of second conductive components 52 may include, for example, a battery cell terminal, a battery cell bus bar, cabling, a shunt, a shunt bridge, a PCB, a relay bus bar, a relay connector, a relay, or the like, but are not limited to such components. Accordingly, in certain embodiments, many or all connections made between the second conductive components 52 may involve direct connection to the battery cells of the lithium ion battery module 28, as described below.

Generally, the second conductive components 52 may be coupled via operations performed at a second side 59 or face of the lithium ion battery module 28. The plurality of second conductive components 52 may be coupled to one another via one or more welds that establish an electrical connection between the plurality of second conductive components 52. In certain embodiments, the plurality of second conductive components 52 may be coupled to one another in second connection planes 60 (e.g., second welding planes). The second connection planes 60 may include one or more planes that are substantially parallel with one another. The second connection planes 60 may be substantially parallel to a face 62 of the housing of the battery module 28. In certain embodiments, the second connection planes 60 may be crosswise (e.g., substantially perpendicular) to the first connection planes 54.

In certain embodiments, utilizing the first connection planes 54 and the second connection planes 60 to separate the nature of the connections made between certain conductive components may improve the efficiency of a battery module construction process. As discussed above, welding dissimilar conductive materials (e.g., copper to aluminum) to one another may create undesirable effects (e.g., galvanic corrosion). Accordingly, a first welding process that couples components having the first conductive material may include different weld settings (e.g., power, inert gas, weld rate, or the like) than a second welding process that couples components having the second conductive material. Utilizing the first connection planes 54 may enable an assembler (e.g., a person or an actuated process) to make all welds coupling the plurality of first conductive components 50 without modifying or adjusting the weld settings. Similarly, utilizing the second connection planes 60 may enable an assembler (e.g., a person or an actuated process) to make all welds coupling the plurality of second conductive components 52 without modifying or adjusting the weld settings. In accordance with present embodiments, the first weld process may be performed at the first side 53 of the lithium ion battery module 28, whereas the second weld process may be performed at the second side 59.

To enable an electrical connection between the battery module 28 and an external load, an electrical connection between battery cell terminals and module terminals may be formed. For example, the plurality of first conductive components 50 may be coupled to the plurality of second conductive components 52 to establish such an electrical connection. In certain embodiments, the battery module 28 may include a bi-metallic interconnecting bus bar 64 that includes the first conductive material on a first end 66 and the second conductive material on a second end 68. The interconnecting bus bar 64 may enable a connection to be made between the plurality of first conductive components 50 and the plurality of second conductive components 52 without welding two dissimilar conductive materials together. For example, the first end 66 may be coupled to the first conductive components 50 in the first connection planes 54 and the second end 68 may be coupled to the second conductive components 52 in the second connection planes 60. In other embodiments, the interconnecting bus bar 64 may include a single conductive material, such that a weld coupling different conductive materials to one another is performed. For example, the interconnecting bus bar 64 may include a third conductive material that has the ability to make a strong, reliable weld with the first conductive material in the first connection planes 54 and the second conductive material in the second connection planes 60. In further embodiments, either of the first or second ends 66, 68 may include the third material.

Figure 4:
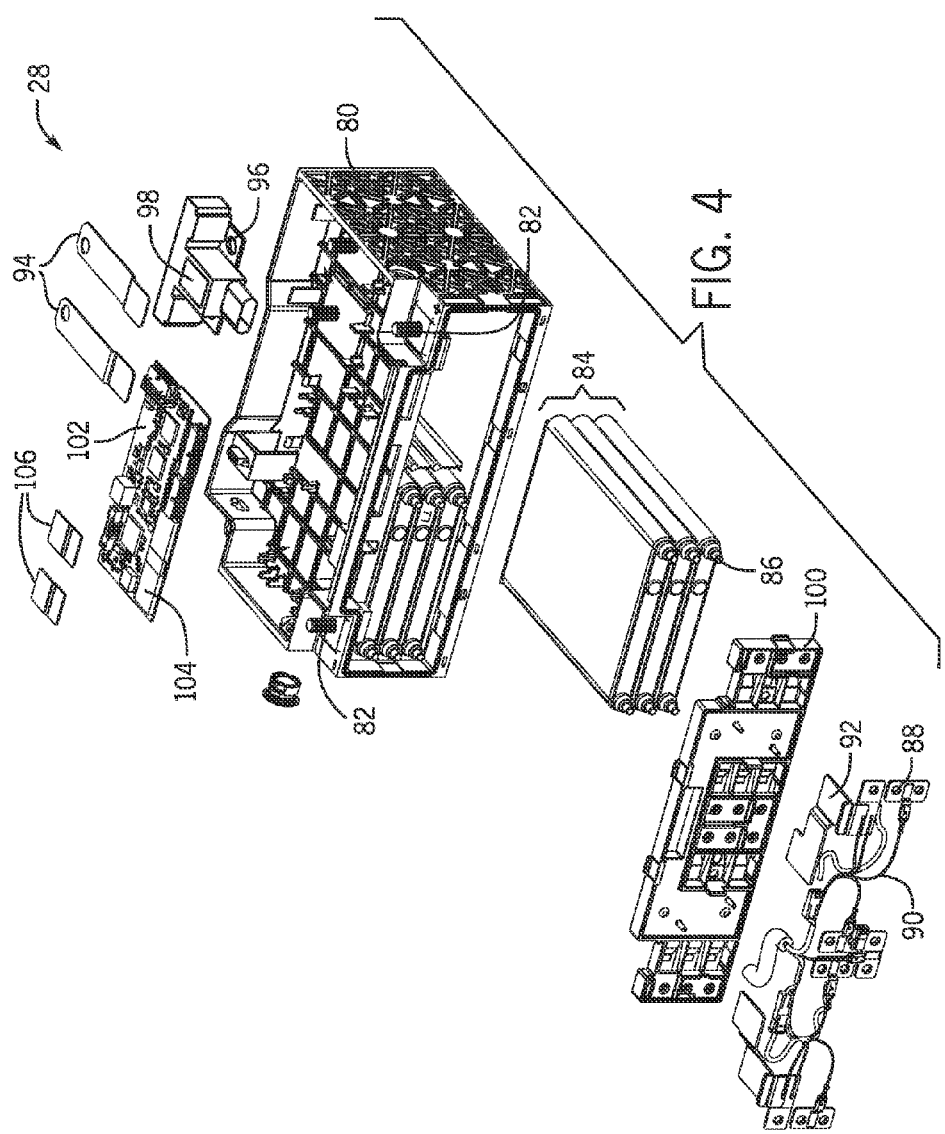
FIG. 4 is an exploded view of components of the battery module of FIG. 3, in accordance with an aspect of the present disclosure.

As mentioned above, the plurality of first conductive components 50 and the plurality of second conductive components 52 may be a variety of components disposed in and/or on the battery module 28. FIG. 4 illustrates an embodiment of the battery module 28 with several example components integrated on or within a housing 80 of the battery module 28. When electrically connected, the components are capable of providing an electrical output at module terminals 82 of the battery module 28. For example, a plurality of battery cells 84 may be positioned in the module housing 80, and may be electrically connected to the module terminals 82 via a series of physical connections made between certain intervening conductive components. The various interconnections that enable the battery cells 84 to be electrically connected to the terminals 82 of the module 28 may be considered to establish an electrical pathway, the nature of which may depend on the type and number of intervening conductive components.

As set forth in FIG. 4, the components establishing the electrical pathway between the battery cells 84 and the module terminals 82 may include, by way of non-limiting example, cell terminals 86, cell bus bars 88, cabling 90, terminal bus bars 92, relay bus bars 94, relay connectors 96, a relay 98, and the module terminals 82. Additionally, certain of the components may be disposed on a carrier 100 that may include a one-piece structure configured to carry and integrate the certain components (e.g., the second conductive components 52). As described in further detail herein with reference to FIG. 6, other conductive components may also be present, including the bimetallic interconnecting bus bar 64.

In certain embodiments, additional electrical connections may also be established, for example to enable a control module (e.g., control module 32 of FIG. 2) on a printed circuit board (PCB) 102 to monitor and control operational parameters of the battery cells 84 and the overall battery module 28. As shown, such electrical connections may be established using a shunt 104 connected to the PCB 102, as well as shunt bridges 106. In certain embodiments, the control module on the PCB 102 may be configured to monitor parameters of the battery cells 84 via sensing components disposed on the carrier 100 or within the battery module housing 80 (e.g., on cabling 90). For example, the sensing components may send signals to the PCB 102 that relate to a temperature and/or a voltage within the battery module 28. The control module on the PCB 102 may control operating parameters of the battery module 28 in response to the signals received. Again, these features are examples, and should not be considered to limit the present disclosure.

Figure 5:
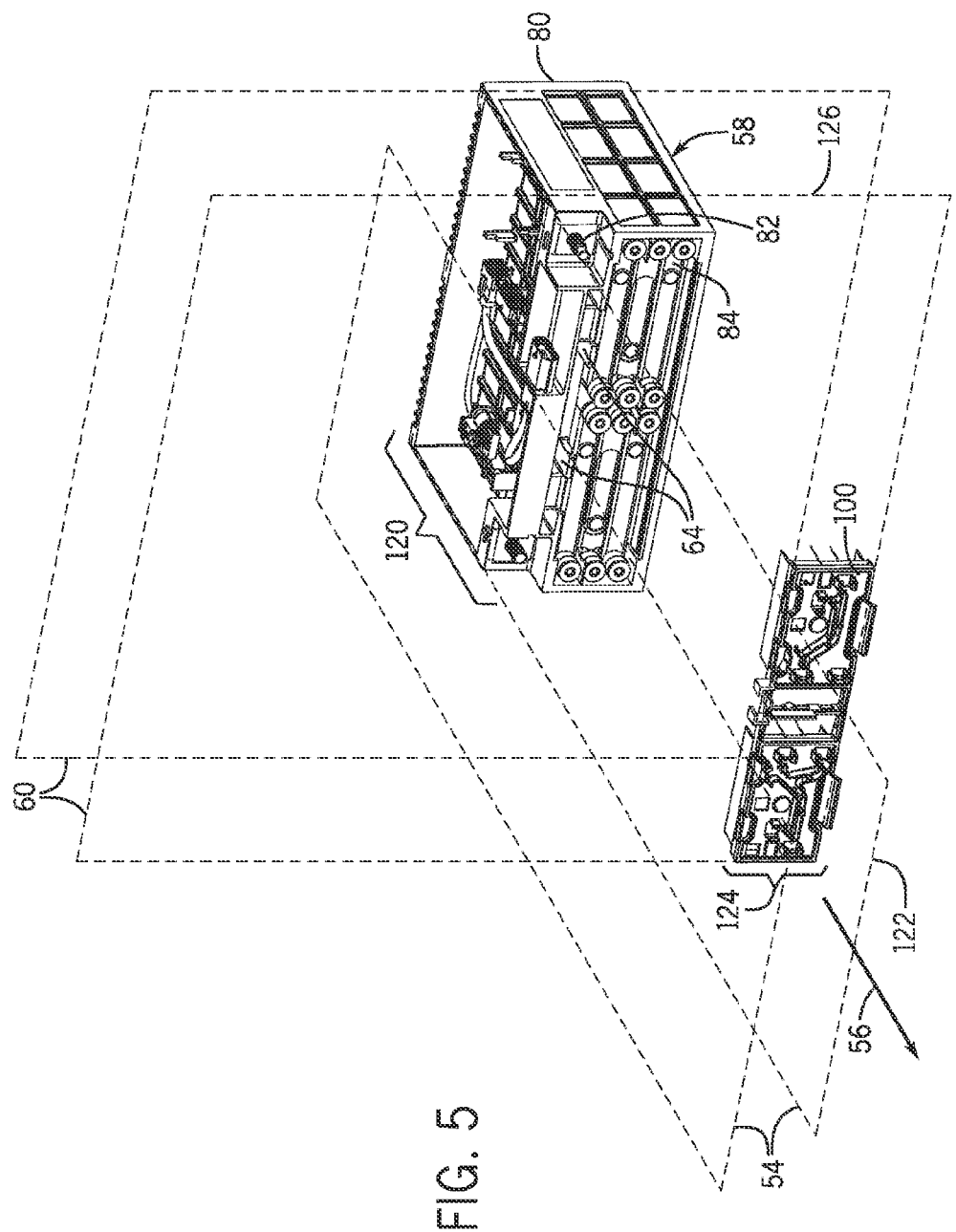
FIG. 5 is an illustration of an embodiment of the battery module components of FIG. 4 with electrical connections formed in separate welding planes, in accordance with an aspect of the present disclosure.

The manner in which these various components are arranged in the battery module 28 may be further appreciated with reference to FIG. 5, which depicts the carrier 100 as exploded away from the housing 80. Also, several electrical connections are depicted as being established, with the exception of electrical interconnections between the battery cells 84 and to the module terminals 82.

As illustrated in FIG. 5, electrical connections between conductive components are divided into the first connection planes 54 and the second connection planes 60. Each set of substantially parallel connection planes 54 and 60 may be considered a set of planes that are accessible from a single orientation of the battery module 28. In this way, connections (e.g., welding connections) can be made for a plurality of electrical components while the battery module 28 is in a single orientation.

In the first connection planes 54, for example, electrical connections may be established between conductive elements along a first portion 120 of the electrical pathway between the battery cells 84 and the module terminals 82. The first portion 120 may include the conductive components that extend from the carrier 100 and to the module terminals 82. In addition, the first connection planes 54 may include connections made between the relay 98 (see FIG. 4) and certain conductive components, as well as connections between the PCB 102 (see FIG. 4) and certain components. These connections need not lie in a single plane, but will generally be oriented along the set of planes 54 substantially parallel to a first base plane 122. Connections made along the first connection planes 54 may be oriented substantially parallel to the first base plane 122, which is illustrated as generally extending along the cell orientation direction 56, and substantially parallel to a base 58 of the module housing 80.

In the second connection planes 60 electrical connections may be established between conductive elements along a second portion 124 of the electrical pathway between the battery cells 84 and the module terminals 82. The second portion 124 may include the conductive components that extend from the battery cells 84 and to the carrier 100. These connections need not lie in a single plane, but will generally be oriented along the set of planes 60 substantially parallel to a second base plane 126. Connections made along the second connection planes 60 may generally be oriented crosswise (e.g., transverse or substantially perpendicular) to the first connection planes 54, and the second connection planes 60 are illustrated as generally extending crosswise (e.g., substantially perpendicular) relative to the cell orientation direction 56 and crosswise relative to the base 58 of the module housing 80.

Separating the planes of welding in the manner set forth above may be advantageous for several reasons. For example, during assembly of the battery module 28, which involves positioning and connecting different module components, such assembly and interconnection may be more efficient due to a reduction in parameter variation between stations of an assembly system.

Figure 6:
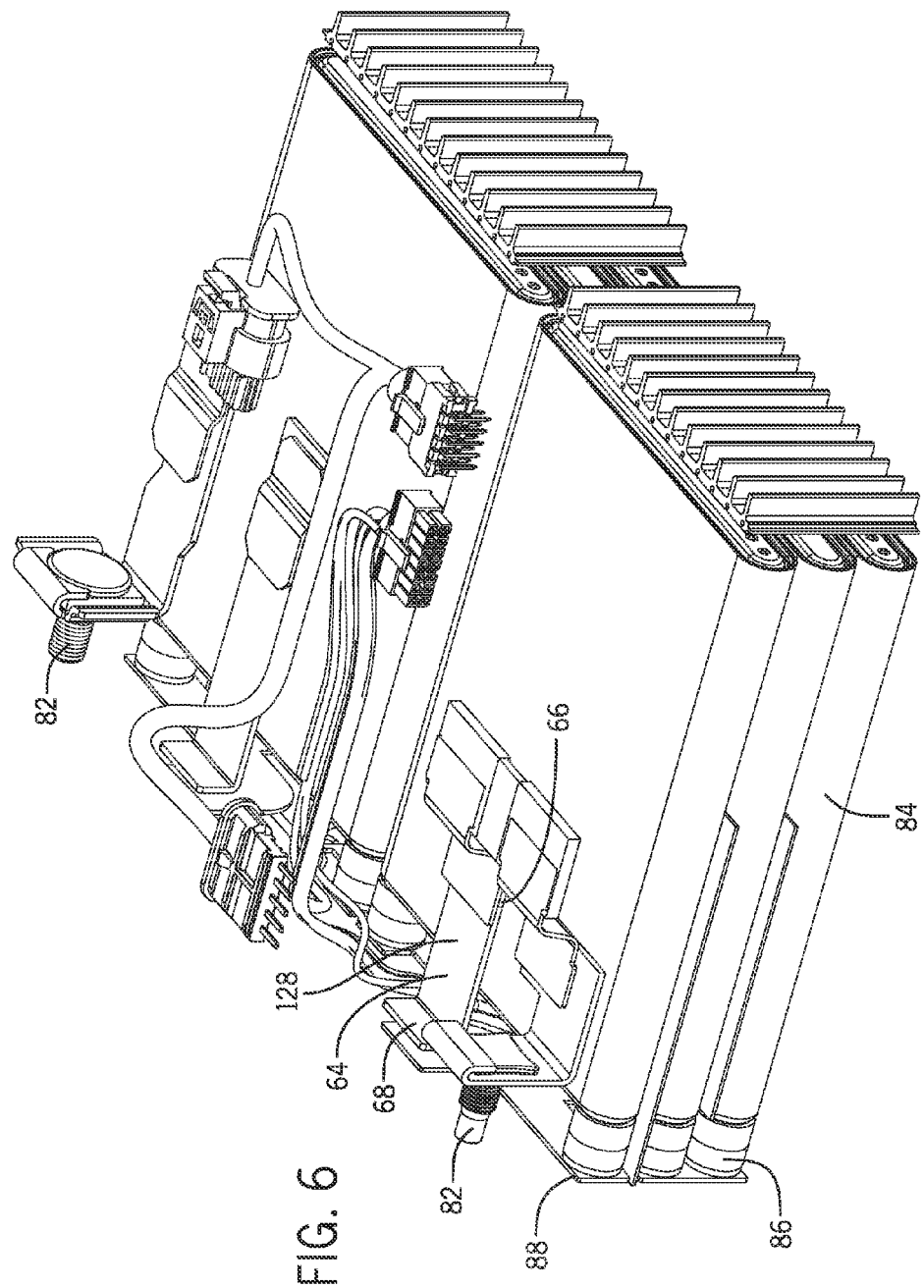
FIG. 6 is an illustration of an embodiment of an interconnecting bus bar, in accordance with an aspect of the present disclosure.

Again, the first connection planes 54 may include connections between components having a first conductive material, and the second connection planes 60 may include connections between components having a second conductive material. In certain embodiments, the respective connection planes 54 and 60 may exclusively include connections for a single conductive material, except for a single transition between the connection planes 54 and 60 using, for example, the interconnecting bus bar 64 as shown in FIG. 6. In accordance with the illustrated embodiment of FIG. 6, the interconnecting bus bar 64 may be bi-metallic, where the first end 66 (e.g., a first portion) includes a first conductive material (e.g., copper) and the second end 68 (e.g., a second portion) includes a second conductive material (e.g., aluminum). Thus, in certain embodiments, the first end 66 of the interconnecting bus bar 64 may be coupled to the module terminal 82. Additionally, and referring to certain components illustrated in FIG. 4, the interconnecting bus bar 64 may be coupled to the shunt bridge 106, which is coupled to the shunt 104. On the other hand, the second end 68 of the interconnecting bus bar 64 may be coupled to other conductive materials, such as the material constituting the cell bus bars 88.

In embodiments that employ the bi-metallic bus bar 64, the bi-metallic bus bar 64 may include a material gradient portion 128 (e.g., a transition portion of the bus bar 64 that may include a mixture of the first conductive material and the second conductive material) or the bi-metallic bus bar 64 may include no material gradient (e.g., a direct connection between the first conductive material and the second conductive material). In still further embodiments, the bi-metallic bus bar 64 may include a third conductive material that may be positioned between the first conductive material on the first end 66 and the second conductive material on the second end 68.

Figure 7:
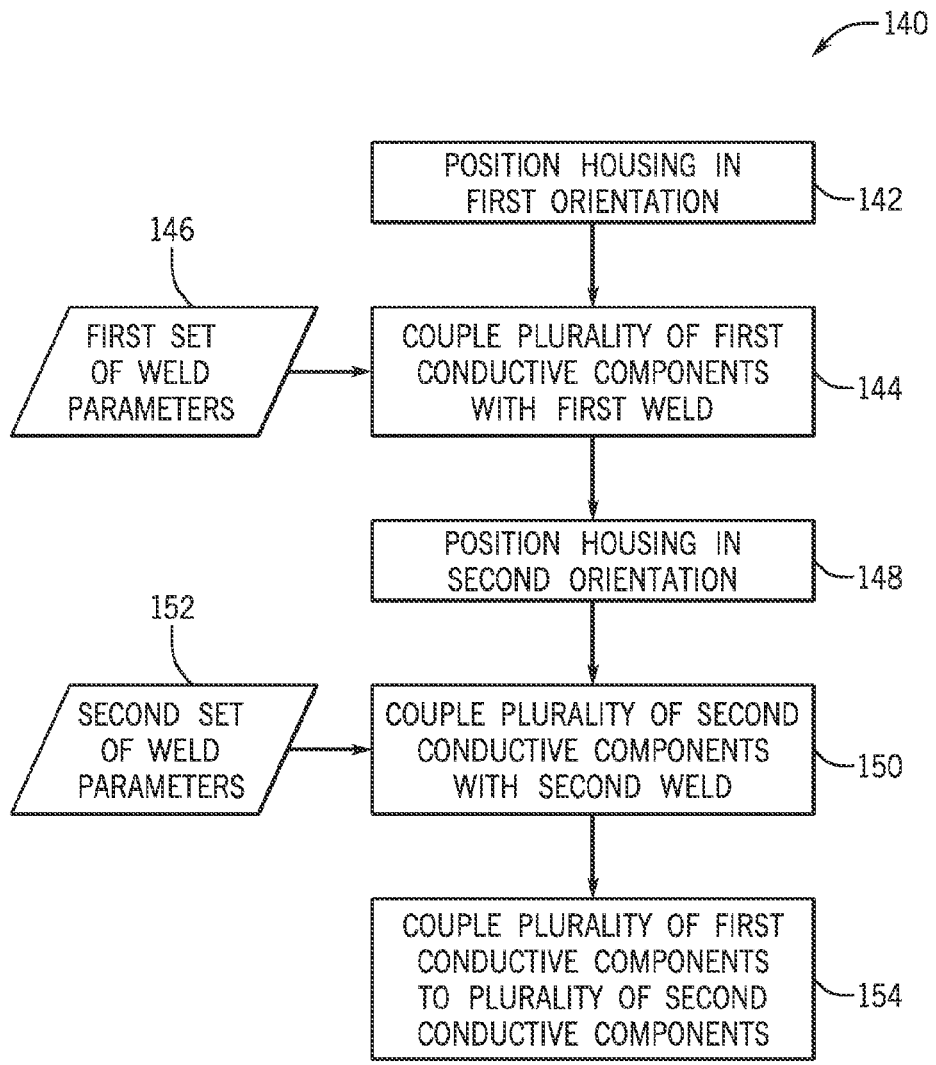
FIG. 7 is a flow chart of a process for constructing the battery module of FIG. 3, in accordance with an aspect of the present disclosure.

FIG. 7 is a flow chart illustrating a method 140 of a process for constructing the battery module 28 in accordance with the present embodiments. At block 142, the battery module housing 80 may begin in a first orientation. For example, the module 28 (e.g., housing 80) may be positioned in an assembly line in a first orientation. At block 144, while the battery module 28 is in the first orientation, various components (e.g., the plurality of first conductive components 50) may be integrated onto or in the housing 80, and a first welding operation may be performed. Integrations of components onto or into the housing 80 may include positioning the components and preparing the components for subsequent welding operations (e.g., the first welding operation).

The first welding operation is intended to represent making one or more welding connections using, for example, a first set of parameters 146 suitable for welding a first type of conductive material (e.g., copper) to the same type of conductive material, or another material that is electrically compatible with the first type (e.g., experiences little to no unwanted galvanic effects). For instance, the first welding operation may include performing welds using the first set of parameters 146, which may be suitable to couple the plurality of first conductive components 50 to one another. In certain embodiments, the component integration and first welding operation may be performed, for example, at a first assembly station using first assembly parameters. In this way, a single station or section of an assembly line (e.g., an automated assembly line) may have a dedicated set of parameters that are repeated across a plurality of module assembly processes. Accordingly, components of the assembly line (e.g., automated components) do not require re-initiation or re-loading of a set of parameters between modules, which may enhance efficiency.

After performing operations to the battery module 28 in the first orientation, the process may include re-positioning of the housing 80 at block 148 to a second orientation. In certain embodiments, the module 28 may be at a second assembly station (e.g., that uses a second set of assembly parameters) and additional component integration may be performed. The additional component integration may include integrating components (e.g., the plurality of second conductive components 52) having a second conductive material into or onto the battery module 28. At block 150, a second welding operation is performed, which is intended to represent making one or more welds using, for example, a second set of parameters 152 suitable for welding the second conductive material. In certain embodiments, the second set of parameters 152 are different from the first set of parameters 146 and the second conductive material is different from the first conductive material. For instance, the second welding operation may include performing welds using the second set of parameters 152, which may be suitable to couple the plurality of second conductive components 52 to one another.

In certain embodiments, the plurality of first conductive components 50 and the plurality of second conductive components 52 may be coupled to one another (e.g., via the interconnecting bus bar 64) at block 152. For example, the plurality of first conductive components 50 and the plurality of second conductive components 52 may be coupled to one another via the bi-metallic interconnecting bus bar 64 after the plurality of first conductive components 50 are coupled to one another and after the plurality of second conductive components 52 are coupled to one another. For example, the bi-metallic interconnecting bus bar 64 may be coupled to the first conductive components 50 in the first connection planes 54 and coupled to the second conductive components 52 in the second connection planes 60. In other embodiments, the plurality of first conductive components 50 may be coupled to one another and/or the plurality of second conductive components 52 may be coupled to one another simultaneously, or after, the interconnected bus bar 64 establishes a connection between a first conductive component of the plurality of first conductive components 50 and a second conductive component of the plurality of second conductive components 52.

One or more of the disclosed embodiments, alone or in combination, may provide one or more technical effects including establishing an electrical path between a cell terminal of an electrochemical cell and a module terminal of a battery module that includes the electrochemical cell. The electrical path generally includes a first segment extending from the cell terminal, a second segment extending from the module terminal, and a transition segment extending between the first segment and the second segment. The first segment and the second segment may be welded to the transition segment. To facilitate ease of manufacturing, all of the welds connecting the first segment are disposed in substantially parallel first planes, and all of the welds connecting the second segment are disposed in substantially parallel second planes. The technical effects and technical problems in the specification are exemplary and are not limiting. It should be noted that the embodiments described in the specification may have other technical effects and can solve other technical problems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A lithium-ion battery module, comprising:
 a housing having a base;
 a battery cell disposed in the housing in a cell orientation direction, wherein the cell orientation direction is substantially parallel to the base; and
 a battery module terminal electrically coupled to a battery cell terminal of the battery cell via an electrical pathway, wherein the battery cell terminal extends from the battery cell in the cell orientation direction, wherein the battery module terminal is configured to provide an electrical output of the battery module when coupled to an electrical load, and wherein the electrical pathway extends from the battery cell terminal to the battery module terminal and is defined by a first portion, a second portion, and an interconnecting portion connecting the first and second portions;
 wherein the first portion of the electrical pathway comprises a plurality of first conductive components having a first conductive material, the plurality of first conductive components are electrically coupled to one another within first connection planes using a first weld technique, a first conductive component of the plurality of first conductive components is directly coupled to the battery module terminal, and the first connection planes are substantially parallel to the base of the housing; and
 wherein the second portion of the electrical pathway comprises a plurality of second conductive components having a second conductive material, the plurality of second conductive components are electrically coupled to one another within second connection planes using a second weld technique, different from the first weld technique, a second conductive component of the plurality of second conductive components is directly coupled to the battery cell terminal of the battery cell, and the second connection planes are oriented crosswise relative to the first connection planes and the cell orientation direction.

2. The lithium-ion battery module of claim 1, wherein the first weld technique includes a first set of weld parameters and the second weld technique includes a second set of weld parameters, different from the first set of weld parameters.

3. The lithium-ion battery module of claim 1, wherein the second connection planes are substantially parallel to one another.

4. The lithium-ion battery module of claim 1, wherein the interconnecting portion comprises the first conductive material at a first end and the second conductive material at a second end, and wherein the interconnecting portion electrically couples the plurality of first conductive components to the plurality of second conductive components.

5. The lithium-ion battery module of claim 4, wherein the interconnecting portion comprises a material gradient portion disposed between the first and second ends and having a mixture of the first conductive material and the second conductive material.

6. The lithium-ion battery module of claim 4, wherein the interconnecting portion comprises a third conductive material positioned between the first end and the second end.

7. The lithium-ion battery module of claim 4, wherein the interconnecting portion couples the plurality of first conductive components to the plurality of second conductive components via a third weld technique to a third conductive component of the plurality of first conductive components at the first end and a fourth weld technique to a fourth conductive component of the plurality of second conductive components at the second end.

8. The lithium-ion battery module of claim 7, wherein one or both of the third weld technique and the fourth weld technique include ultrasonic welding or laser welding.

9. The lithium-ion battery module of claim 1, wherein the plurality of first conductive components are physically and electrically coupled to one another using only the first weld technique and the plurality of second conductive components are physically and electrically coupled to one another using only the second weld technique.

10. The lithium-ion battery module of claim 1, wherein the plurality of first conductive components comprises one or more of a terminal bus bar, a relay bus bar, a relay connector, a shunt, and a shunt bridge.

11. The lithium-ion battery module of claim 10, wherein the plurality of second conductive components comprises one or more of a plurality of cell bus bars, a relay, and a PCB.

12. The lithium-ion battery module of claim 1, wherein the first conductive material comprises copper and the second conductive material comprises aluminum.

13. A method for constructing a lithium-ion battery module, comprising:
  accessing a first side of a housing of the lithium ion battery module, wherein the lithium-ion battery module comprises a battery cell, wherein the battery cell is disposed in the housing in a cell orientation direction, wherein the cell orientation direction is substantially parallel to a base of the housing, and wherein the battery cell comprises a battery cell terminal extending from the battery cell in the cell orientation direction;
  coupling a plurality of first conductive components to one another via a first plurality of welds on the first side, wherein a first conductive component of the plurality of first conductive components is directly coupled to a battery module terminal of the lithium ion battery module, the first plurality of welds are produced within first connection planes using a first conductive material, and the first connection planes are substantially parallel to the base of the housing;
  accessing a second side of the housing, crosswise to the first side;
  coupling a plurality of second conductive components to one another via a second plurality of welds on the second side, wherein a second conductive component of the plurality of second conductive components is directly coupled to the battery cell terminal of the battery cell, the second plurality of welds are produced within second connection planes using a second conductive material, different from the first conductive material, and the second connection planes are oriented crosswise relative to the first connection planes and the cell orientation direction; and
  coupling the plurality of first conductive components to the plurality of second conductive components via an interconnecting portion comprising the first conductive material at a first end and the second conductive material at a second end.

14. The method of claim 13, wherein the first plurality of welds are produced using a first set of weld parameters configured to weld two copper components to one another and the second plurality of welds are produced using a second set of weld parameters configured to weld two aluminum components to one another.

15. A lithium-ion battery module, comprising:
  a housing having a base;
  a battery cell disposed in the housing and having a cell orientation direction, wherein the cell orientation direction is substantially parallel to the base;
  a battery module terminal electrically coupled to a battery cell terminal of the battery cell via an electrical pathway, wherein the battery cell terminal extends from the battery cell in the cell orientation direction, wherein the electrical pathway extends from the battery cell terminal of the battery cell to the battery module terminal, and wherein the electrical pathway is produced according to a process, comprising:
    accessing a first side of the housing;
    coupling a plurality of first conductive components to one another via a first plurality of welds on the first side, wherein a first conductive component of the plurality of first conductive components is directly coupled to the battery module terminal, the first plurality of welds are produced within first connection planes using a first conductive material, and the first connection planes are substantially parallel to a base of the housing;
    accessing a second side of the housing, crosswise to the first side;
    coupling a plurality of second conductive components to one another via a second plurality of welds on the second side, wherein a second conductive component of the plurality of second conductive components is directly coupled to the battery cell terminal of the battery cell, the second plurality of welds are produced within second connection planes using a second conductive material, different from the first conductive material, and the second connection planes are oriented crosswise relative to the first connection planes and the cell orientation direction; and coupling the plurality of first conductive components to the plurality of second conductive components via an interconnecting portion comprising the first conductive material at a first end and the second conductive material at a second end.

16. The lithium-ion battery module of claim 15, wherein the first conductive material comprises copper and the second conductive material comprises aluminum.

* * * * *